US011809090B2

(12) United States Patent
Golotsvan et al.

(10) Patent No.: US 11,809,090 B2
(45) Date of Patent: Nov. 7, 2023

(54) COMPOSITE OVERLAY METROLOGY TARGET

(71) Applicant: KLA Corporation, Milpitas, CA (US)

(72) Inventors: Anna Golotsvan, Qiryat Tivon (IL);
Inna Steely-Tarshish, Haifa (IL);
Mark Ghinovker, Yoqneam Ilit (IL);
Rawi Dirawi, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 277 days.

(21) Appl. No.: 16/996,254

(22) Filed: Aug. 18, 2020

(65) Prior Publication Data

US 2021/0240089 A1 Aug. 5, 2021

Related U.S. Application Data

(60) Provisional application No. 63/032,217, filed on May 29, 2020, provisional application No. 62/967,951, filed on Jan. 30, 2020.

(51) Int. Cl.
*G01N 21/47* (2006.01)
*G03F 7/00* (2006.01)
*G01N 23/2251* (2018.01)

(52) U.S. Cl.
CPC ......... *G03F 7/70633* (2013.01); *G01N 21/47* (2013.01); *G01N 23/2251* (2013.01); *G03F 7/70608* (2013.01); *G03F 7/70683* (2013.01); *G01N 2223/07* (2013.01)

(58) Field of Classification Search
CPC .............. G01N 21/47; G01N 21/956; G01N 21/95623; G01N 23/2251; G03F 7/70633; G03F 7/70608
See application file for complete search history.

(56) References Cited

U.S. PATENT DOCUMENTS

| 7,541,201 | B2 | 6/2009 | Ghinovker |
| 8,330,281 | B2 | 12/2012 | Ghinovker et al. |
| 9,214,317 | B2 | 12/2015 | Shur |
| 9,476,698 | B2 | 10/2016 | Abdulhalim et al. |
| 9,857,678 | B1 * | 1/2018 | Park ........................ G03F 7/203 |
| 10,190,979 | B2 | 1/2019 | Manassen et al. |

(Continued)

FOREIGN PATENT DOCUMENTS

| KR | 100282340 B1 | 4/2001 |
| KR | 1020110001262 U | 2/2011 |
| WO | 2018004511 A1 | 1/2018 |

OTHER PUBLICATIONS

PCT International Search Report and Written Opinion for International Application No. PCT/US2021/015144 dated May 21, 2021, 8 pages.

*Primary Examiner* — David E Smith
*Assistant Examiner* — Hsien C Tsai
(74) *Attorney, Agent, or Firm* — Suiter Swantz pc llo

(57) ABSTRACT

A metrology target includes a first set of pattern elements compatible with a first metrology mode along one or more directions, and a second set of pattern elements compatible with a second metrology mode along one or more directions, wherein the second set of pattern elements includes a first portion of the first set of pattern elements, and wherein the second set of pattern elements is surrounded by a second portion of the first set of pattern elements not included in the second set of pattern elements.

49 Claims, 11 Drawing Sheets

(56) References Cited

U.S. PATENT DOCUMENTS

| | | |
|---|---|---|
| 10,527,951 B2 | 1/2020 | Yohanan et al. |
| 2004/0082139 A1* | 4/2004 | Kim .................... G03F 7/70633 |
| | | 438/975 |
| 2013/0035888 A1 | 2/2013 | Kandel et al. |
| 2013/0242305 A1* | 9/2013 | Cohen ................... H01L 23/544 |
| | | 356/400 |
| 2014/0169861 A1 | 1/2014 | Apfel |
| 2017/0153558 A1 | 6/2017 | Tel et al. |
| 2019/0063911 A1* | 2/2019 | Verma .................. G01B 11/272 |

* cited by examiner

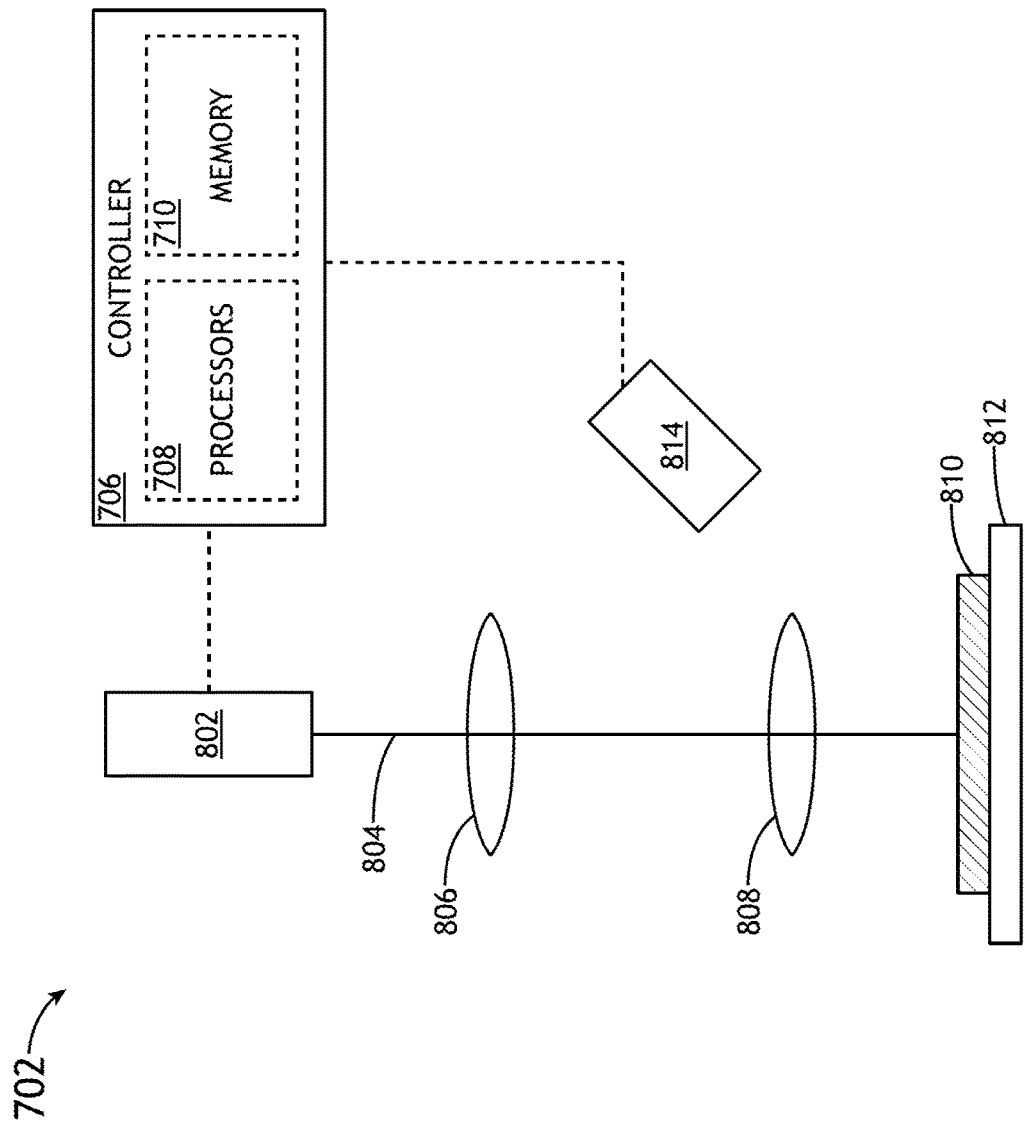

US 11,809,090 B2

COMPOSITE OVERLAY METROLOGY TARGET

CROSS-REFERENCE TO RELATED APPLICATION

The present application claims the benefit under 35 U.S.C. § 119(e) of the following applications: U.S. Provisional Patent Application Ser. No. 62/967,951, filed Jan. 30, 2020, entitled COMBINED OPTICAL AND EOVL TARGET FOR BIASES CALIBRATION, naming Anna Golotsvan, Inna Steely-Tarshish, and Mark Ghinovker as inventors; and U.S. Provisional Patent Application Ser. No. 63/032,217, filed May 29, 2020, entitled COMPOSITE OVERLAY METROLOGY TARGET, naming Anna Golotsvan, Inna Steely-Tarshish, and Mark Ghinovker as inventors. Each of the foregoing applications is incorporated herein by reference in the entirety.

TECHNICAL FIELD

The present disclosure is related generally to overlay metrology and, more particularly, to overlay metrology using a combined target.

BACKGROUND

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample. However, the accuracy and/or repeatability of an overlay measurement of an overlay target may be sensitive to the particular location on a sample or the particular characteristics of the target features to be measured. For example, target features of a small size may require the use of metrology systems capable of achieving greater resolution of a sample target. In this regard, as chip sizes continually shrink, many samples contain target features resolvable at varying resolutions. The inclusion of various, independent targets on a unitary sample may result in undesirable mismatches across the different layers of the sample. Accordingly, it may be desirable to provide a metrology target compatible with a plurality of metrology modes capable of varying resolutions.

SUMMARY

A metrology target is disclosed, in accordance with one or more illustrative embodiments of the present disclosure. In one illustrative embodiment, the metrology target includes a first set of pattern elements compatible with a first metrology mode along one or more directions. In another illustrative embodiment, the metrology target includes a second set of pattern elements compatible with a second metrology mode along one or more directions, where the second set of pattern elements includes a first portion of the first set of pattern elements, and where the second set of pattern elements is surrounded by a second portion of the first set of pattern elements not included in the second set of pattern elements.

A system is disclosed, in accordance with one or more illustrative embodiments of the present disclosure. In one illustrative embodiment, the system includes one or more metrology sub-systems configured to acquire one or more metrology signals from one or more metrology targets of the sample. In another illustrative embodiment, the one or more metrology sub-systems include an illumination source, one or more illumination elements configured to direct an illumination beam from the illumination source to the sample, one or more detectors, and one or more projection elements configured to collect illumination emanating from the sample and direct the illumination to the one or more detectors. In another illustrative embodiment, the system includes one or more controllers having one or more processors communicatively coupled to the one or more detectors. In another illustrative embodiment, the one or more processors are configured to execute a set of program instructions maintained in memory, where the set of program instructions is configured to cause the one or more processors to: receive, from the one or more metrology sub-systems operating in a first metrology mode, one or more signals indicative of illumination emanating from a first set of pattern elements of one or more metrology targets of the sample; receive from the one or more metrology sub-systems operating in a second metrology mode, one or more signals indicative of illumination emanating from a second set of pattern elements of the one or more metrology targets, where the one or more metrology targets of the sample include: the first set of pattern elements, where the first set of pattern elements is compatible with the first metrology mode along one or more directions, and the second set of pattern elements, where the second set of pattern elements is compatible with the second metrology mode along one or more directions, where the second set of pattern elements includes a first portion of the first set of pattern elements, and where the second set of pattern elements is surrounded by a second portion of the first set of pattern elements not included in the second set of pattern elements; determine one or more overlay parameters of the first set of pattern elements based on one or more signals acquired from the first set of pattern elements in the first metrology mode; and determine one or more overlay parameters of the second set of pattern elements based on one or more signals acquired from the second set of pattern elements in the second metrology mode.

A method of measuring overlay is disclosed, in accordance with one or more illustrative embodiments of the present disclosure. In one illustrative embodiment, the method of measuring overlay includes illuminating a sample having one or more metrology targets; detecting, in a first metrology mode, illumination emanating from a first set of pattern elements of the one or more metrology targets of the sample; detecting, in a second metrology mode, illumination emanating from a second set of pattern elements of the one or more metrology targets of the sample; determining one or more overlay parameters of the first set of pattern elements based on the illumination emanating from the first set of pattern elements; and determining one or more overlay parameters of the second set of pattern elements based on the illumination emanating from the second set of pattern elements.

A method of forming an overlay target is disclosed, in accordance with one or more embodiments of the present disclosure. In one illustrative embodiment, the method of forming an overlay target includes forming a first set of pattern elements, where the first set of pattern elements are compatible with a first metrology mode along one or more directions; and forming a second set of pattern elements, where the second set of pattern elements is compatible with a second metrology mode along one or more directions, where the second set of pattern elements includes a first portion of the first set of pattern elements, and where the second set of pattern elements is surrounded by a second portion of the first set of pattern elements not included in the second set of pattern elements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 8A is a conceptual view illustrating a metrology sub-system, in accordance with one or more embodiments of the present disclosure.

DETAILED DESCRIPTION

Figure 1:
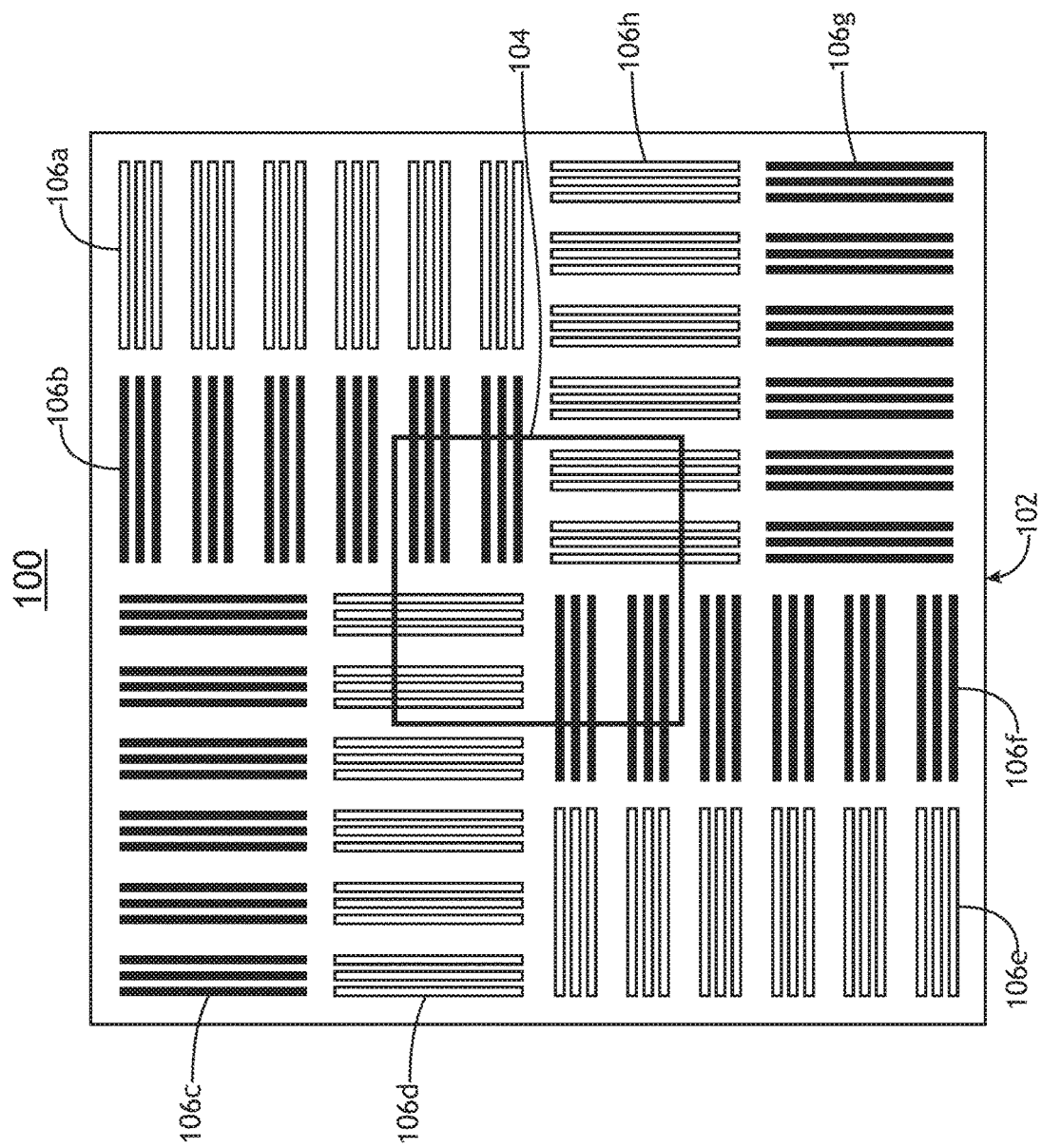
FIG. 1 is a top view of a metrology target, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to combined overlay metrology targets compatible with one or more modes of measurement.

It is recognized herein that a semiconductor device may be formed as multiple printed layers of patterned material on a substrate. Each printed layer may be fabricated through a series of process steps such as, but not limited to, one or more material deposition steps, one or more lithography steps, or one or more etching steps. Further, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

The minimum feature size as well as the density of features of a printed pattern in a lithography step is limited at least in part by the optical resolution of projection optics of the lithography system. However, features near or below the resolution of a lithography system may be fabricated using various lithography techniques.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated. Further, metrology targets are typically characterized as having one or more measurement cells, where each cell includes printed elements in one or more layers on the sample. A metrology measurement may then be based on any combination of measurements of the size, orientation, or location (e.g., pattern placement) of printed elements in a single cell or between multiple cells. For example, one or more cells of an overlay metrology target may include printed elements on two or more sample layers arranged such that the relative positions of elements of each layer may be indicative of offset errors (e.g., pattern placement errors (PPE)) in a particular layer or overlay errors associated with registration errors between sample layers. By way of another example, process-sensitive metrology targets may include printed elements on a single sample layer, where one or more characteristics of the printed elements (e.g., width or critical dimension (CD), sidewall angle, position, or the like) are indicative of one or more process metrics such as, but not limited to, the dose of illumination during a lithography step or a focal position of the sample in a lithography tool during a lithography step.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features. By way of another example, scatterometry-based overlay metrology tools may illuminate an overlay target (e.g., a grating-over-grating metrology target, or the like) and capture an overlay signal including an angular distribution of radiation emanating from the overlay target associated with diffraction, scattering, and/or reflection of the illumination beam. Accordingly, overlay may be determined based on models of the interaction of an illumination beam with the overlay target.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. However, resolution limits of optical metrology tools typically require feature sizes larger than device-scale features, which may introduce a systematic error between the optical metrology measurement and the actual overlay on device features of interest, depending on the wavelengths of an illumination source. By way of another example, particle-based metrology tools such as, but not limited to, a scanning electron microscope (SEM) metrology tool (e.g., a critical dimension SEM (CD-SEM), or the like), or a focused ion beam (FIB) metrology tool may resolve device-scale features. Further, particle-beam metrology tools may have a limited ability to simultaneously measure features on multiple sample layers based on the particle penetration depth. For example, low-energy particle beams may be used to characterize a top layer (e.g., a current layer), while relatively higher-energy particle beams may penetrate deeper into the sample to characterize features on previously-fabricated layers. However, many particle-based metrology tools may have relatively lower throughput than optical metrology tools and may potentially induce damage to one or more layers during measurement. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2014/0169861 titled "APPARATUS AND METHOD FOR DETECTING OVERLAY ERRORS USING SCATTEROMETRY" and published on Sep. 2, 2004, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1 is a top view of a metrology target 100, in accordance with one or more embodiments of the present disclosure. In one embodiment, the metrology target 100 is two-fold rotationally symmetric. The metrology target 100 may include a first set of pattern elements 102. The first set of pattern elements 102 includes multiple pattern elements. For example, the first set of pattern elements 102 may include, but is not limited to, pattern elements 106a-106h. One or more of the pattern elements 106a-106h may display two-fold rotational symmetry. Portions of the first set of pattern elements 102 may be formed at multiple layers of the metrology target 100. For example, pattern elements 106a, 106d, 106e, and 106h may be formed on a first layer (as may be indicated by the light pattern features in FIG. 1) of the metrology target 100, and pattern elements 106b, 106c, 106f, and 106g may be formed on a second layer (as may be indicated by the dark pattern features in FIG. 1) of the metrology target 100. In this regard, an offset (e.g., PPE) of the first layer relative to the second layer of the metrology target 100 may be characterized by measuring the relative positions of the pattern elements 106a-106h of the first set of pattern elements 102 located at different layers of the metrology target 100. The one or more pattern elements 106a-106h may include one or more segmented portions (e.g., repeated, periodic sets of reference features).

In one embodiment, each layer of the metrology target 100 may include two pattern elements 106a-106h configured for measurement along a first orthogonal direction (e.g., an X-direction), and two pattern elements 106 configured for measurement along a second orthogonal direction (e.g., a Y-direction). By way of an additional example, the first layer of the metrology target 100 may include pattern elements 106a and 106e configured for measurement along a Y-direction. As an additional example, the first layer of the metrology target 100 may include pattern elements 106d and 106h configured for measurement along an X-direction. By way of another example, the second layer of the metrology target may include pattern elements 106b and 106f configured for measurement along a Y-direction, and pattern elements 106c and 106g configured for measurement along an X-direction.

The first set of pattern elements 102 may be configured to be compatible with a first metrology mode along one or more orthogonal directions (e.g., an X-direction and/or a Y-direction). For example, one or more pattern elements 106a-106h of the first set of pattern elements 102 may include edges defined along the X-direction and the Y-direction such that the relative location of the pattern elements 106a-106h of the first set of pattern elements may be readily measured (e.g., by one or more metrology sub-systems, or the like). As a further example, the first set of pattern elements 102 may be compatible with any optical metrology mode known in the art to be suitable for the purposes contemplated by the present disclosure, including, without limitation, advanced imaging metrology (AIM), advanced imaging metrology in-die (AIMid), and triple advanced imaging metrology (Triple AIM).

The metrology target 100 may include a second set of pattern elements 104 compatible with a second metrology mode. The second set of pattern elements 104 may include a first portion of the first set of pattern elements 102. The second set of pattern elements 104 may be surrounded by a second portion of the first set of pattern elements 102. In this regard, the second portion of the first set of pattern elements 102 is not included in the second set of pattern elements 104.

For example, the second set of pattern elements 104 may include an interior portion of the first set of pattern elements 102, as illustrated in FIG. 1 by box 104. The metrology target 100 may be configured such that the metrology target 100 need not be moved in order for multiple metrology measurements in different metrology modes to be taken. For example, the first set of pattern elements 102 and the second set of pattern elements 104 may share a center point such that both the first metrology mode and the second metrology mode may be utilized (e.g., by one or more metrology sub-systems) at the common center point. In this sense, the amount of time required to conduct metrology measurements in at least two metrology modes may be decreased.

The second set of pattern elements 104 may be configured to be compatible with the second metrology mode along one or more orthogonal directions (e.g., an X-direction and/or a Y-direction). For example, one or more portions of the pattern elements 106a-106h included within the second set of pattern elements 104 may include edges defined along the X-direction and the Y-direction such that the relative location of the one or more portions of the pattern elements 106a-106h may be readily measured (e.g., by one or more metrology sub-systems, or the like). As a further example, the second set of pattern elements 104 may be compatible with any optical metrology mode or particle-beam metrology mode known in the art to be suitable for the purposes contemplated by the present disclosure, including, without limitation, advanced imaging metrology in-die (AIMid) metrology, and electron-beam metrology.

It is noted that while the metrology target 100 is described in the context of an example target and pattern elements displaying two-fold symmetry this feature should not be interpreted as a limitation on the scope of the present disclosure. Rather, it is noted herein that the target 100 and/or the pattern elements 106a-106h may display four-fold rotational symmetry.

Figure 2:
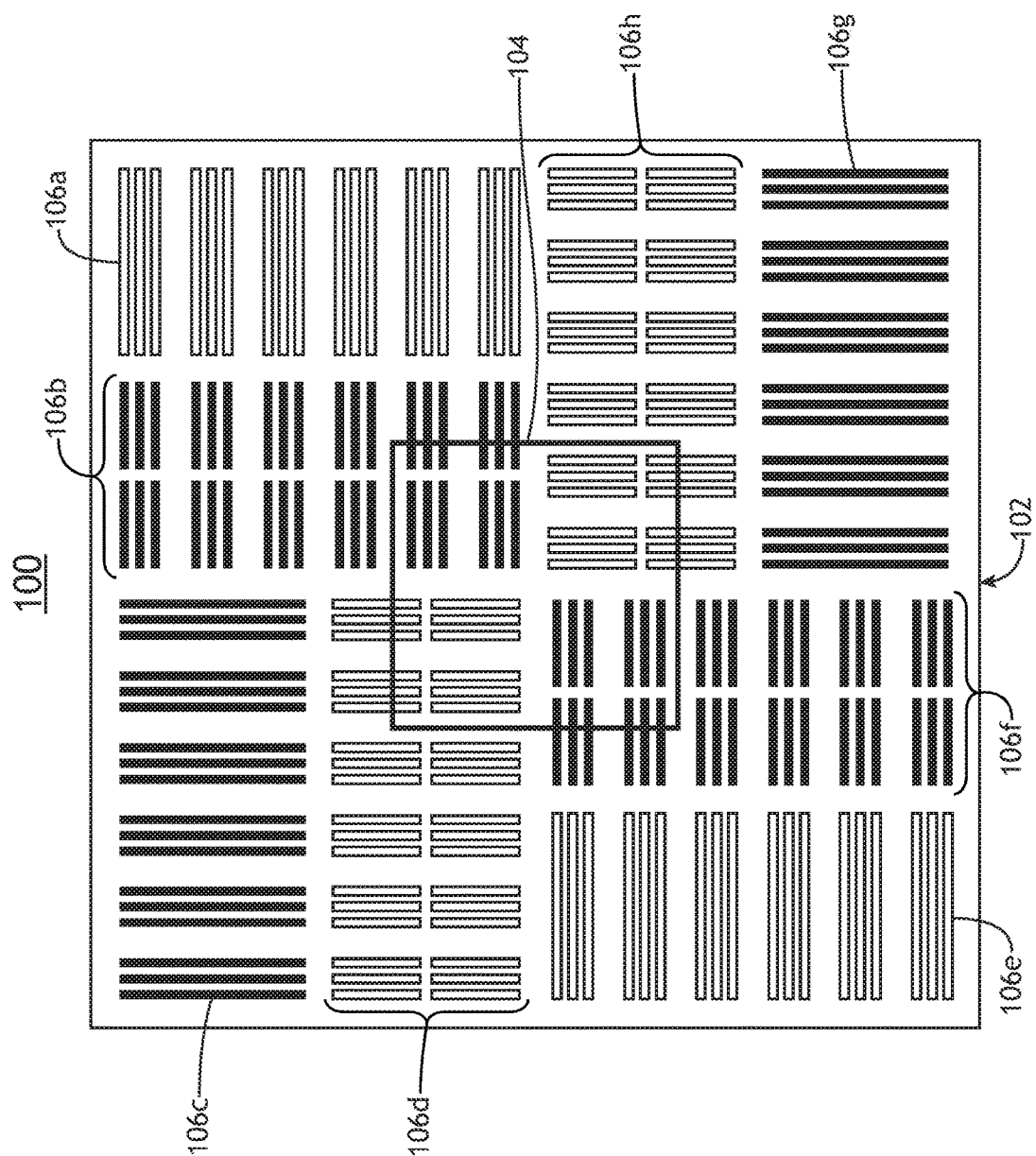
FIG. 2 is a top view of a metrology target, in accordance with one or more embodiments of the present disclosure.

FIG. 2 is a top view of a metrology target 100, in accordance with one or more embodiments of the present disclosure. The second set of pattern elements 104 may be configured such that additional edges along one or more orthogonal directions are included within a region of interest of the metrology target 100. For example, one or more portions of the second set of pattern elements 104 may include two or more segmented portions along one or more orthogonal directions of the metrology target 100. By way of an additional example, each of pattern elements 106b, 106d, 106f, and 106h may be formed such that they are divided into two or more sets of segmented portions along one or more orthogonal directions of the metrology target 100. In this sense, the second set of pattern elements 104 may be configured for use on samples having a smaller area or smaller sample features. The second set of pattern elements 104 may allow the metrology target 100 to be compatible with various metrology sub-systems and various metrology modes. For example, the second set of pattern elements 104 may allow the metrology target 100 to be used with two or more metrology sub-systems having different resolutions. By way of another example, the second set of pattern elements 104 may allow the metrology target 100 to be used on samples of a small size, and/or on samples having a dense array of sample features.

It is noted that while the metrology target 100 is described in the context of an example target and pattern elements displaying two-fold symmetry this feature should not be interpreted as a limitation on the scope of the present disclosure. Rather, it is noted herein that the target 100 and/or the second set of pattern elements 104 may display four-fold rotational symmetry.

Figure 3:
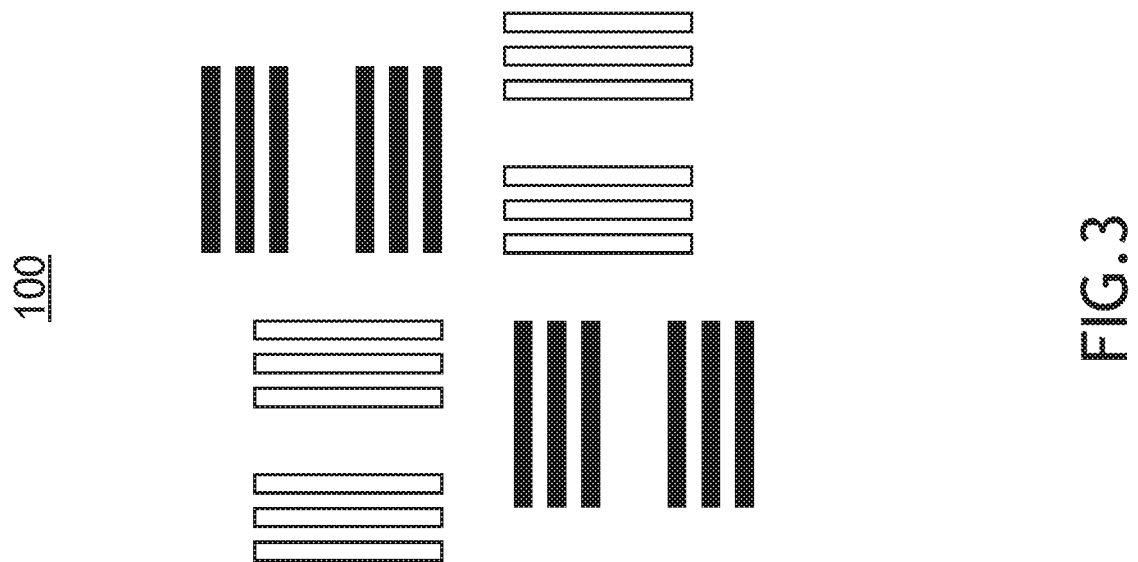
FIG. 3 is a top view of a metrology target, in accordance with one or more embodiments of the present disclosure.

FIG. 3 is a top view of a metrology target 100, in accordance with one or more embodiments of the present disclosure. The metrology target 100 may be of various sizes configured to be used in close proximity to sample features. For example, the metrology target 100 may be produced as an in-die (e.g., along a scribe line) metrology target. By way of another example, the metrology target 100 may be formed in-die based on design restrictions, spacing, surrounding features of the sample, and the like. In this regard, the metrology target 100 may be configured for use with any in-die metrology mode, including, without limitation, AIMid.

Figure 4:
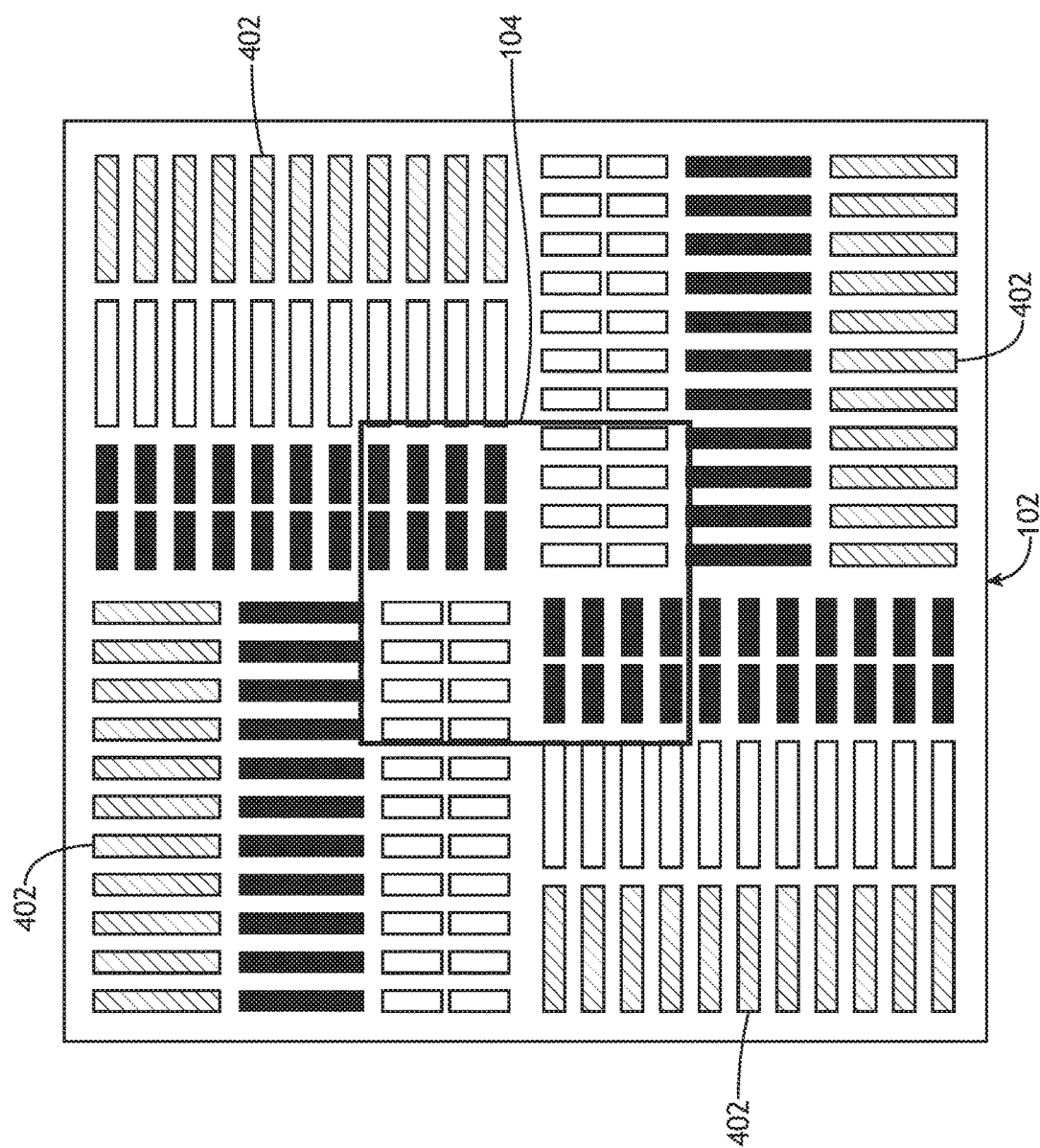
FIG. 4 is a top view of a metrology target, in accordance with one or more embodiments of the present disclosure.

FIG. 4 is a top view of a metrology target 100, in accordance with one or more embodiments of the present disclosure. The first set of pattern elements 102 may include one or more additional portions 402 configured to be compatible with one or more optical metrology modes. In one embodiment, the additional portions 402 are four-fold rotationally symmetric. The first set of pattern elements 102 may include one or more additional portions 402 configured for use with any optical metrology mode known in the art to be suitable for the purposes contemplated by the present disclosure, including, without limitation, Triple AIM metrology. In one embodiment, the one or more additional portions 402 may be formed as one or more segmented portions at multiple layers of the metrology target 100. In another embodiment, the one or more additional portions 402 may be formed in a single layer on which neither any other portion of the first set of pattern elements 102 nor any portion of the second set of pattern elements 104 may be formed. In another embodiment, one or more portions of the one or more additional portions 402 may be formed on a layer on which one or more portions of the first set of pattern elements 102 and/or one or more portions of the second set of pattern elements are formed.

Figure 5:
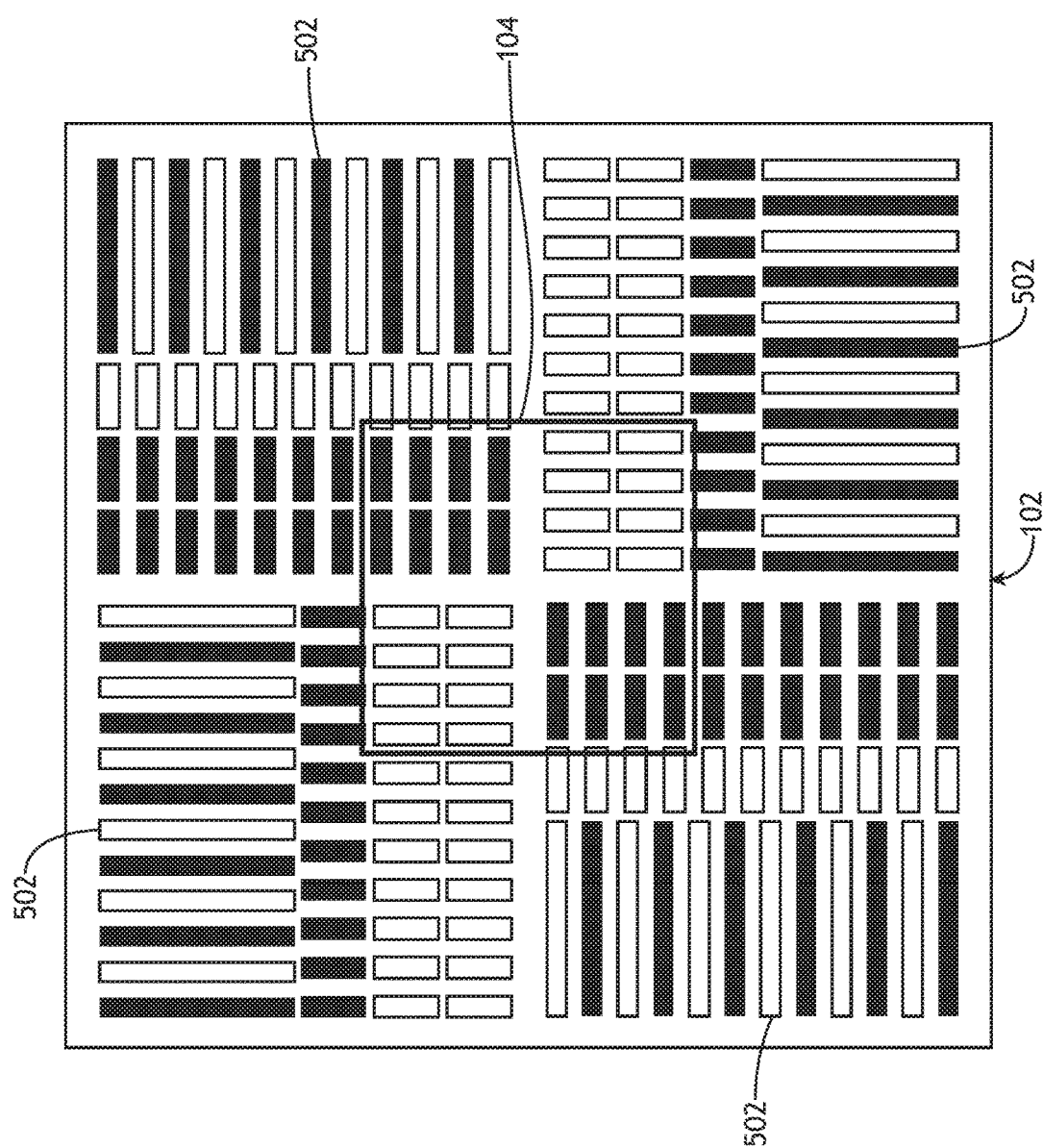
FIG. 5 is a top view of a metrology target, in accordance with one or more embodiments of the present disclosure.

FIG. 5 is a top view of a metrology target 100, in accordance with one or more embodiments of the present disclosure. The metrology target 100 may include a third set of pattern elements 502 configured for use with a non-imaging metrology mode, such as a scatterometry-based overlay (SCOL) metrology mode. The third set of pattern elements 502 may include one or more alternating parallel gratings having an equal pitch (e.g., distance of separation). In one embodiment, the pattern elements of the third set of pattern elements 502 are two-fold rotationally symmetric. The third set of pattern elements 502 may be configured such that incident radiation directed to the third set of pattern elements 502 may be diffracted by the one or more alternating parallel gratings, and the diffracted radiation may be detected and analyzed (e.g., by one or more metrology sub-systems) to determine one or more overlay parameters based on the angular distribution of the radiation.

The third set of pattern elements 502 may surround one or more portions of the first set of pattern elements 102. The third set of pattern elements 502 may be formed at multiple layers of the metrology target 100. For example, one or more pattern elements of the third set of pattern elements 502 may be formed on a first layer of the metrology target 100, and one or more pattern elements of the third set of pattern elements 502 may be formed on a second layer of the metrology target 100. The third set of pattern elements 502 may be configured to share a center of the metrology target 100 with the first set of pattern elements 102 and the second set of pattern elements 104. In this regard, an offset (e.g., PPE) of the first layer relative to the second layer of the metrology target 100 may be characterized by measuring the relative positions of the pattern elements of the third set of pattern elements 502 located at different layers of the metrology target 100.

It is noted that while the metrology target 100 is described in the context of an example target and pattern elements displaying four-fold symmetry this feature should not be interpreted as a limitation on the scope of the present disclosure. Rather, it is noted herein that the target 100 and/or the third set of pattern elements 502 may display two-fold rotational symmetry.

Figure 6:
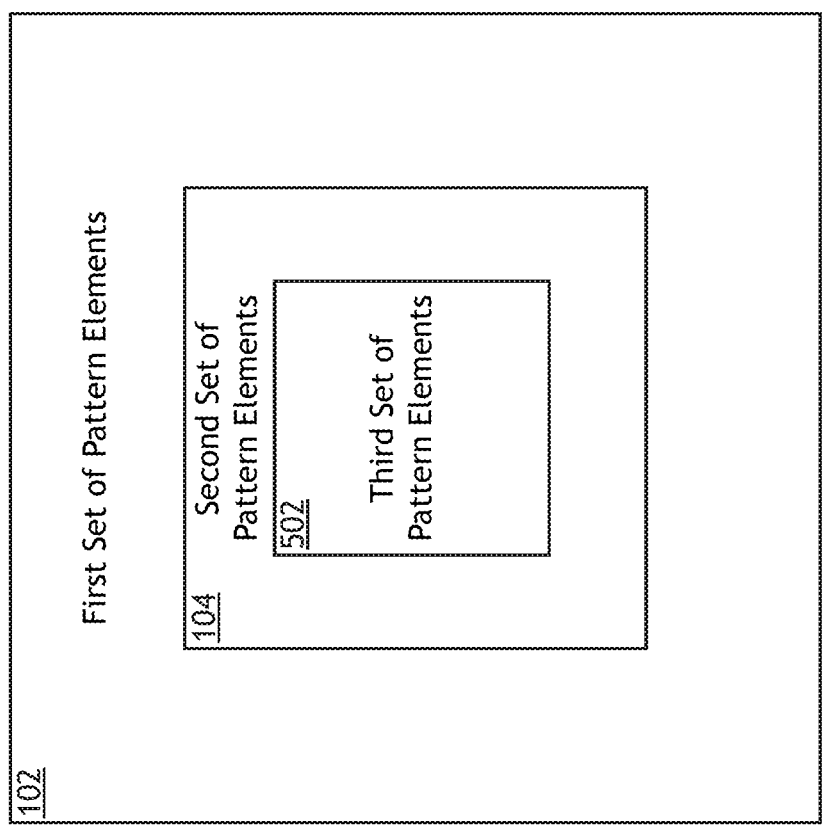
FIG. 6 is a conceptual representation of a metrology target, in accordance with one or more embodiments of the present disclosure.

FIG. 6 is a conceptual representation of a metrology target 100, in accordance with one or more embodiments of the present disclosure. The metrology target 100 may be configured such that each of the first set of pattern elements 102, the second set of pattern elements 104, and the third set of pattern elements 502 are arranged and/or formed on a sample in a manner that takes into account one or more measurement parameters of the sample. For example, each of the first set of pattern elements 102, the second set of pattern elements 104, and the third set of pattern elements 502 may be arranged and/or formed on a sample to ensure that one or more metrology sub-systems may accurately determine one or more overlay parameters (e.g., offset (PPE), scaling, rotation, and other correctable terms) of the sample. By way of another example, all or some of the first set of pattern elements 102, the second set of pattern elements 104, or the third set of pattern elements 502 may be arranged such that one or more metrology modes may be used on one or more portions of the sample where different metrology modes (e.g., metrology modes with greater resolution) are necessary for accurate and desirable metrology. It is noted that the design of the metrology target 100, and the relative placement and/or formation of each of the first set of pattern elements 102, the second set of pattern elements 104, and the third set of pattern elements 502 of metrology target may be configured to correspond with one or more of an illumination wavelength of one or more sub-systems configured for use with the metrology target 100, a wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. In this regard, the metrology target 100 may enable more efficient and accurate metrology of a sample requiring a plurality of metrology modes. For example, the combination in the metrology target 100 of the first set of pattern elements 102, the second set of pattern elements 104, and/or the third set of pattern elements 502, may enable one or more metrology recipes to be shared between one or more metrology sub-systems operating in different metrology modes.

The metrology target 100 may be configured for use in the calibration of metrology systems. For example, the metrology target 100 may be used for signal-crunching (e.g., inclusion and analysis of data related to the accuracy of metrology measurements using different metrology modes) in in-die target measurements. By way of another example, the first set of pattern elements 102 and the second set of pattern elements 104 of the metrology target 100 may reduce inaccuracies in target fabrication resulting from target placement and target architecture bias because the first set of pattern elements 102, the second set of pattern elements 104, and the third set of pattern elements 502 share a common center.

Figure 7:
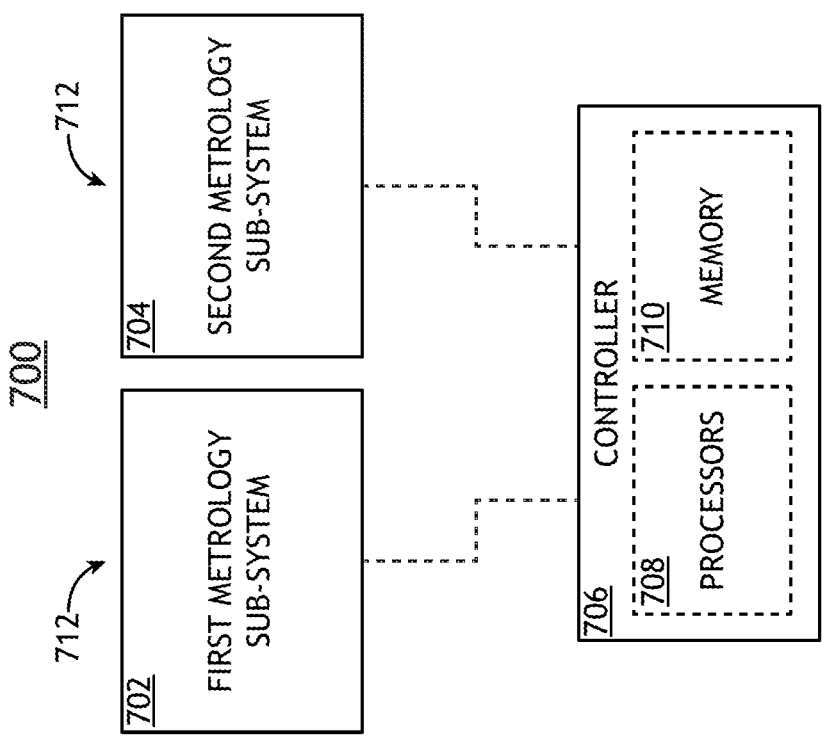
FIG. 7 is a simplified block diagram view of a metrology system, in accordance with one or more embodiments of the present disclosure.

FIG. 7 illustrates a simplified block diagram of a metrology system 700, in accordance with one or more embodiments of the present disclosure. In one embodiment, the metrology system 700 includes one or more metrology sub-systems 712. For example, the metrology system 700 may include a first metrology sub-system 702 and a second metrology sub-system 704, each of which may be configured to acquire overlay signals from overlay targets based on any number of overlay recipes. Each of the first metrology sub-system 702 and the second metrology sub-system 704 may operate in either an imaging mode or a non-imaging mode. For example, in an imaging mode, individual overlay target elements may be resolvable within the illuminated spot on the sample (e.g., as part of a bright-field image, a dark-field image, a phase-contrast image, or the like). By way of another example, each of the first metrology sub-system 702 and the second metrology sub-system 704 may operate as a scatterometry-based overlay (SCOL) metrology tool in which radiation from the sample is analyzed at a pupil plane to characterize the angular distribution of radiation from the sample (e.g., associated with scattering and/or diffraction of radiation by the sample).

Each of the first metrology sub-system 702 and the second metrology sub-system 704 may direct illumination to a sample and may further collect radiation emanating from the sample to generate an overlay signal suitable for the determination of overlay of two or more sample layers. Each of the first metrology sub-system 702 and the second metrology sub-system 704 may include any type of overlay metrology tool known in the art suitable for generating overlay signals suitable for determining overlay associated with overlay targets on a sample, including, without limitation, any optical metrology tool (e.g., an advanced imaging metrology (AIM) tool, an advanced imaging metrology in-die (AIMid) tool, a triple advanced imaging metrology (Triple AIM) tool, and the like), any particle-based metrology tool (e.g., an electron-beam metrology tool), or a scatterometry-based overlay (SCOL) metrology tool. It is noted that the embodiments of the present disclosure are not limited to a metrology system 700 having only a first metrology sub-system 702 and a second metrology sub-system 704, and that the metrology system 700 may include at least three metrology sub-systems. For example, the metrology system 700 may include an optical metrology tool, a particle-based metrology tool, and a scatterometry-based overlay metrology tool.

The one or more metrology sub-systems 712 may be configurable to generate overlay signals based on any number of recipes defining measurement parameters for acquiring an overlay signal suitable for determining overlay of an overlay target. For example, a recipe the one or more metrology sub-systems 712 may include, but is not limited to, an illumination wavelength, a detected wavelength of radiation emanating from the sample, a spot size of illumination on the sample, an angle of incident illumination, a polarization of incident illumination, wave plan of the incident beam, a position of a beam of incident illumination on an overlay target, a position of an overlay target in the focal volume of the overlay metrology tool, or the like.

In another embodiment, the overlay metrology system 700 includes a controller 706 communicatively coupled to the one or more metrology sub-systems 712. The controller 706 may be configured to direct the one or more metrology sub-systems 712 to generate overlay signals based on one or more selected recipes. The controller 706 may be further configured to receive data including, but not limited to, overlay signals from the one or more metrology sub-systems 712. Additionally, the controller 706 may be configured to determine overlay associated with an overlay target based on the acquired overlay signals.

In another embodiment, the controller 706 includes one or more processors 708. For example, the one or more processors 708 may be configured to execute a set of program instructions maintained in a memory device 710, or memory. The one or more processors 708 of a controller 706 may include any processing element known in the art. In this sense, the one or more processors 708 may include any microprocessor-type device configured to execute algorithms and/or instructions. Further, the memory device 710 may include any storage medium known in the art suitable for storing program instructions executable by the associated one or more processors 708. For example, the memory device 710 may include a non-transitory memory medium. As an additional example, the memory device 710 may include, but is not limited to, a read-only memory, a random-access memory, a magnetic or optical memory device (e.g., disk), a magnetic tape, a solid-state drive and the like. It is further noted that memory device 710 may be housed in a common controller housing with the one or more processors 708.

FIG. 8A is a conceptual view illustrating the first metrology sub-system 702, in accordance with one or more embodiments of the present disclosure. As shown in FIG. 8A and previously described in the present disclosure, the first metrology sub-system 702 may include a particle-based metrology tool, such as an electron-beam metrology tool (e.g., a SEM, a CD-SEM, or the like).

In one embodiment, the first metrology sub-system 702 includes a particle source 802 (e.g., an electron beam source, an ion beam source, or the like) to generate a particle beam 804 (e.g., an electron beam, a particle beam, or the like). The particle source 802 may include any particle source known in the art suitable for generating a particle beam 804. For example, the particle source 802 may include, but is not limited to, an electron gun or an ion gun. In another embodiment, the particle source 802 is configured to provide a particle beam with a tunable energy. For example, a particle source 802 including an electron source may, but is not limited to, provide an accelerating voltage in the range of 0.1 kV to 30 kV. As another example, a particle source 802 including an ion source may, but is not required to, provide an ion beam with an energy in the range of 1 to 50 keV.

In another embodiment, the first metrology sub-system 702 includes one or more particle focusing elements 806. For example, the one or more particle focusing elements 806 may include, but are not limited to, a single particle focusing element or one or more particle focusing elements forming a compound system. In another embodiment, the one or more particle focusing elements 806 include a particle objective lens 808 configured to direct the particle beam 804 to a sample 810 located on a sample stage 812. Further, the one or more particle sources 802 may include any type of electron lenses known in the art including, but not limited to, electrostatic, magnetic, uni-potential, or double-potential lenses.

In another embodiment, the first metrology sub-system includes at least one particle detector 814 to image or otherwise detect particles emanating from the sample 810. In one embodiment, the particle detector 814 includes an electron collector (e.g., a secondary electron collector, a backscattered electron detector, or the like). In another embodiment, the particle detector 814 includes a photon detector (e.g., a photodetector, an x-ray detector, a scintillating element coupled to photomultiplier tube (PMT) detector, or the like) for detecting electrons and/or photons from the sample surface.

It is to be understood that the description of the first metrology sub-system 702 as depicted in FIG. 8A and the associated descriptions above are provided solely for illustrative purposes and should not be interpreted as limiting. For example, the first metrology sub-system 702 may include a multi-beam and/or a multi-column system suitable for simultaneously interrogating a sample 810. In a further embodiment, the first metrology sub-system 702 may include one or more components (e.g., one or more electrodes) configured to apply one or more voltages to one or more locations of the sample 810. In this regard, the first metrology sub-system 702 may generate voltage contrast imaging data.

It is recognized herein that the penetration depth of the particle beam 804 in the sample 810 may depend on the particle energy such that higher-energy beams typically penetrate deeper into the sample 810. In one embodiment, the first metrology sub-system 702 may utilize different particle energies to interrogate different layers of the device based on the penetration depth of the particle beam 804 into the sample 810. For example, the first metrology sub-system 702 may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

Figure 8B:
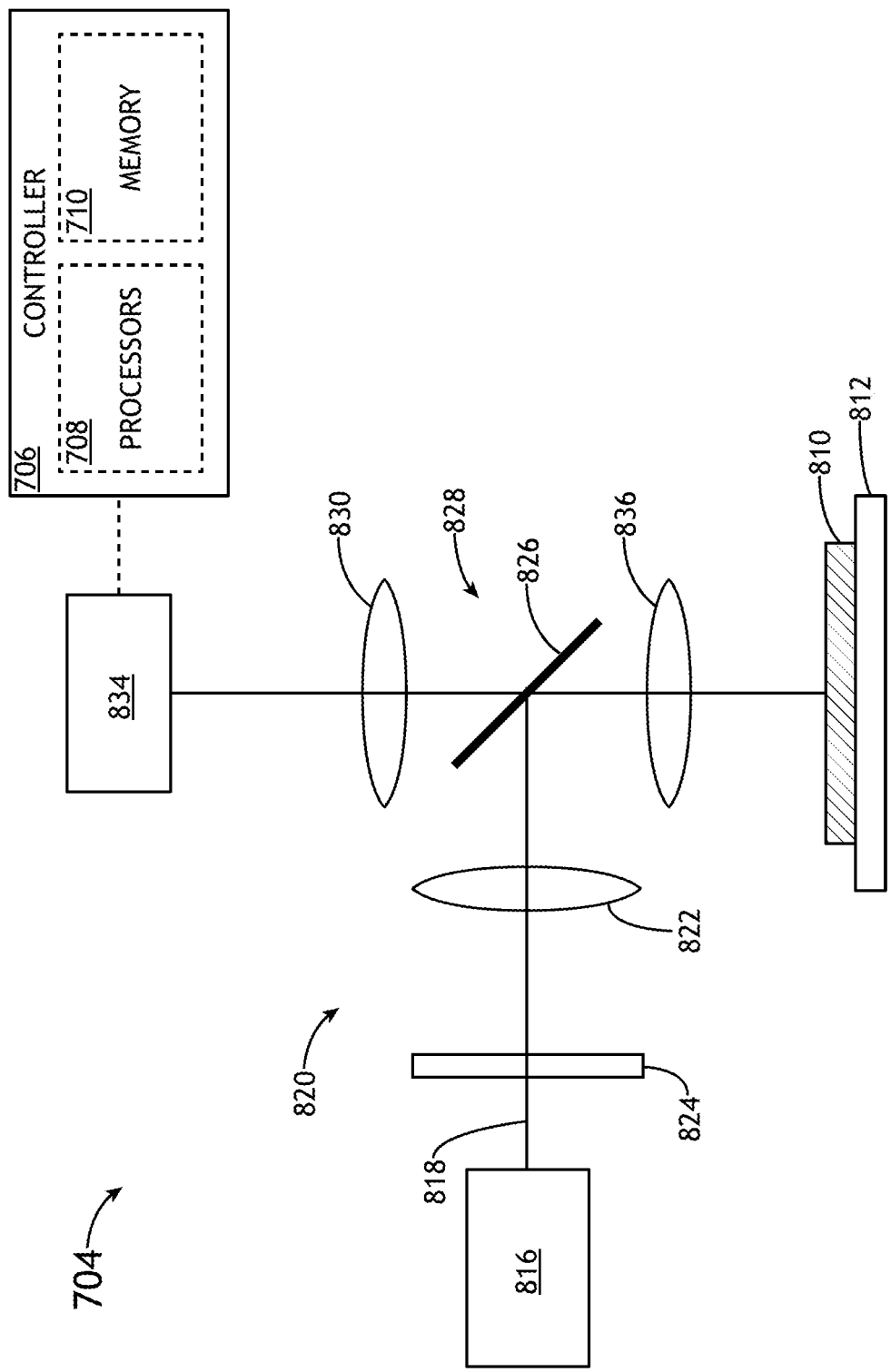
FIG. 8B is a conceptual view illustrating a metrology sub-system, in accordance with one or more embodiments of the present disclosure.

FIG. 8B is a conceptual view illustrating the second metrology sub-system 704, in accordance with one or more embodiments of the present disclosure. As shown in FIG. 8B and previously described in the present disclosure, the second metrology sub-system 704 may include an optical metrology tool. In one embodiment, the second metrology sub-system 704 may include any type of optical metrology tool known in the art suitable for generating metrology data of a sample, including, without limitation, an optical metrology tool configured to generate and/or detect an optical illumination beam having x-ray, ultraviolet (UV), infrared (IR), or visible light wavelengths. By way of another example, the second metrology sub-system 704 may include an advanced imaging metrology (AIM) tool, an advanced imaging metrology in-die (AIMid) tool, or a triple advanced imaging metrology (Triple AIM) tool.

In one embodiment, the second metrology sub-system 704 includes an optical illumination source 816 configured to generate an optical illumination beam 818. The optical illumination beam 818 may include one or more selected wavelengths of radiation including, but not limited to, x-ray, ultraviolet (UV) light, visible light, or infrared (IR) light.

The optical illumination source 816 may be any type of illumination source known in the art suitable for generating an optical illumination beam 818.

The optical illumination source 816 may include any type of illumination source suitable for providing an optical illumination beam 818. In one embodiment, the optical illumination source 816 is a laser source. For example, the optical illumination source 816 may include, but is not limited to, one or more narrowband laser sources, a broadband laser source, a supercontinuum laser source, a white light laser source, or the like. In this regard, the optical illumination source 816 may provide an optical illumination beam 818 having high coherence (e.g., high spatial coherence and/or temporal coherence). In another embodiment, the optical illumination source 816 includes a laser-sustained plasma (LSP) source. For example, the optical illumination source 816 may include, but is not limited to, a LSP lamp, a LSP bulb, or a LSP chamber suitable for containing one or more elements that, when excited by a laser source into a plasma state, may emit broadband illumination. In another embodiment, the optical illumination source 816 includes a lamp source. For example, the optical illumination source 816 may include, but is not limited to, an arc lamp, a discharge lamp, an electrode-less lamp, or the like. In this regard, the optical illumination source 816 may provide an optical illumination beam 818 having low coherence (e.g., low spatial coherence and/or temporal coherence).

In another embodiment, the optical illumination source 816 directs the optical illumination beam 818 to a sample 810 via an illumination pathway 820. The illumination pathway 820 may include one or more illumination pathway lenses 822 or additional optical components 824 suitable for modifying and/or conditioning the optical illumination beam 818. For example, the one or more optical components 824 may include, but are not limited to, one or more polarizers, one or more filters, one or more beam splitters, one or more diffusers, one or more homogenizers, one or more apodizers, or one or more beam shapers. The illumination pathway 820 may further include an objective lens 826 configured to direct the optical illumination beam 818 to the sample 810.

In another embodiment, the sample 810 is disposed on a sample stage 812. The sample stage 812 may include any device suitable for positioning and/or scanning the sample 810 within the second metrology sub-system 704. For example, the sample stage 812 may include any combination of linear translation stages, rotational stages, tip/tilt stages, or the like.

In another embodiment, the second metrology sub-system 704 includes a detector 834 configured to capture light emanating from the sample 810 through a collection pathway 828. The collection pathway 828 may include, but is not limited to, one or more collection pathway lenses 830 for collecting light from the sample 810. For example, a detector 834 may receive light reflected or scattered (e.g., via specular reflection, diffuse reflection, and the like) from the sample 810 via one or more collection pathway lenses 830. By way of another example, a detector 834 may receive light generated by the sample 810 (e.g., luminescence associated with absorption of the optical illumination beam 818, or the like). By way of another example, a detector 834 may receive one or more diffracted orders of light from the sample 810 (e.g., 0-order diffraction, ±1 order diffraction, ±2 order diffraction, and the like).

The detector 834 may include any type of detector known in the art suitable for measuring illumination received from the sample 810. For example, a detector 834 may include, but is not limited to, a CCD detector, a TDI detector, a photomultiplier tube (PMT), an avalanche photodiode (APD), a complementary metal-oxide-semiconductor (CMOS) sensor, or the like. In another embodiment, a detector 834 may include a spectroscopic detector suitable for identifying wavelengths of light emanating from the sample 810.

In one embodiment, the detector 834 is positioned approximately normal to the surface of the sample 810. In another embodiment, the second metrology sub-system 704 includes a beamsplitter 826 oriented such that the objective lens 836 may simultaneously direct the optical illumination beam 818 to the sample 810 and collect light emanating from the sample 810. Further, the illumination pathway 820 and the collection pathway 828 may share one or more additional elements (e.g., objective lens 836, apertures, filters, or the like).

Figure 9:
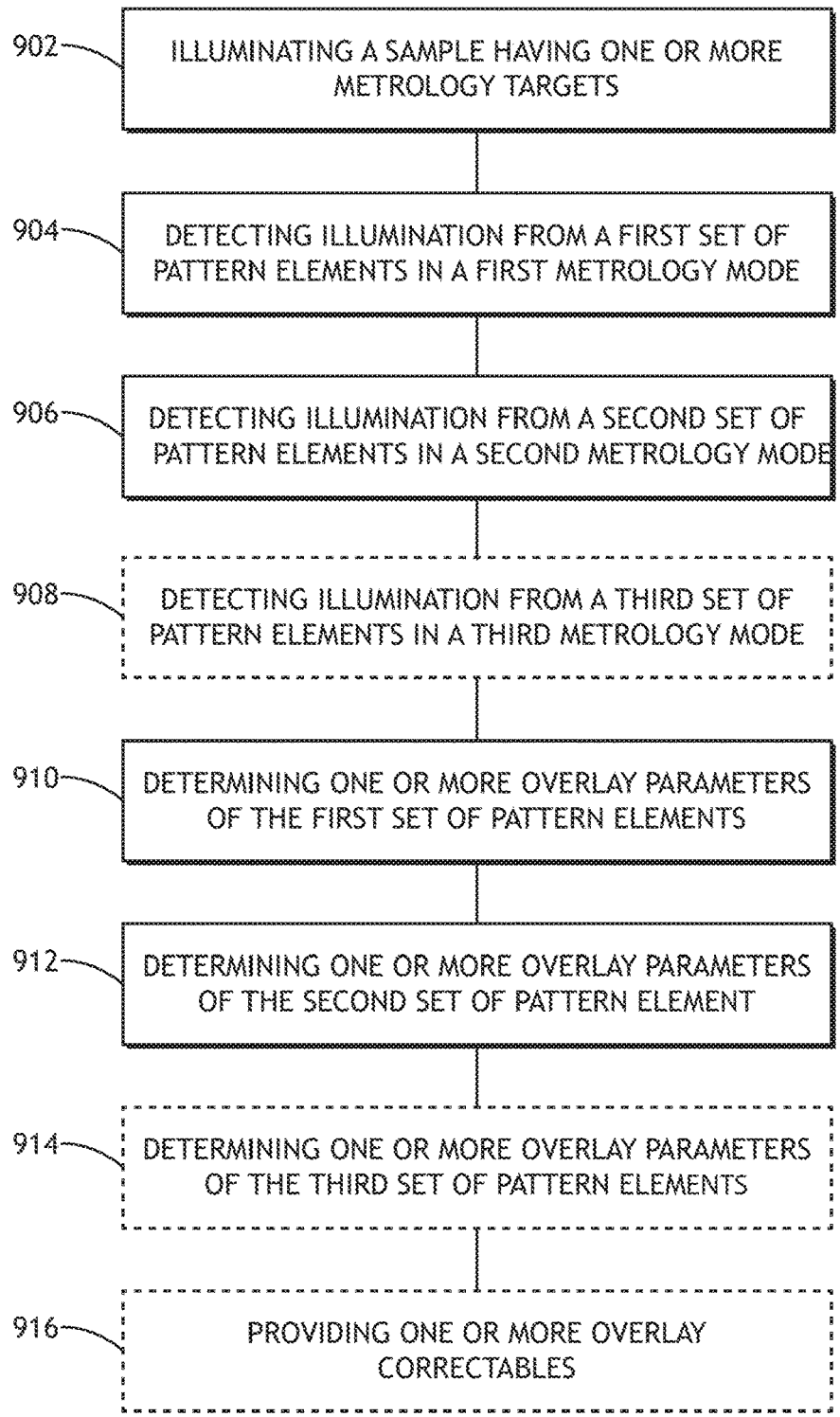
FIG. 9 is a process flow diagram depicting the steps of a method of measuring overlay, in accordance with one or more embodiments of the present disclosure.

FIG. 9 illustrates a process flow diagram depicting the steps of a method 900 of measuring overlay, in accordance with one or more embodiments of the present disclosure.

In Step 902, a sample having one or more metrology targets 100 is illuminated. For example, the one or more metrology sub-systems 712 may direct an illumination beam onto the sample 810. As used herein, the term "illumination beam" may refer to any radiant beam, including, without limitation, the particle beam 804 and the optical illumination beam 818.

In Step 904, illumination emanating from the first set of pattern elements 102 of the metrology target 100 is detected in a first metrology mode. For example, the optical illumination beam 818 may be detected by the detector 834 of the second metrology sub-system 704 configured as an optical metrology tool.

In Step 906, illumination emanating from the second set of pattern elements 104 of the metrology target 100 is detected in a second metrology mode. For example, the particle beam 804 may be detected by the particle detector 814 of the first metrology sub-system 702 configured as a particle-based metrology tool.

In some embodiments, the method 900 includes a Step 908 wherein illumination emanating from the third set of pattern elements 502 of the metrology target 100 is detected in a third metrology mode. For example, one of the one or more metrology sub-systems 712 may detect radiation diffracted from the sample 810.

In Step 910, one or more overlay parameters of the first set of pattern elements 102 of the metrology target 100 are determined. For example, the one or more processors 708 of the one or more controllers 706 may analyze one or more signals indicative of illumination emanating from the first set of pattern elements 102 using an algorithm corresponding to a first metrology mode. By way of another example, the one or more processors 708 may apply one or more algorithms (e.g., AIM, AIMid algorithms) to determine one or more overlay parameters of the first set of pattern elements 102.

In Step 912, one or more overlay parameters of the second set of pattern elements 104 of the metrology target 100 are determined. For example, the one or more processors 708 of the one or more controllers 706 may analyze one or more signals indicative of illumination emanating from the second set of pattern elements 104 using an algorithm corresponding to a second metrology mode. By way of another example, the one or more processors 708 may apply one or more algorithms (e.g., an SEM characterization algorithm) to determine one or more overlay parameters of the second set of pattern elements 104.

In some embodiments, the method 900 may include a Step 914 wherein one or more overlay parameters of the third set of pattern elements 502 of the metrology target 100 are determined. For example, the one or more processors 708 may analyze one or more signals indicative of illumination emanating from the third set of pattern elements 502 using an algorithm corresponding to a third metrology mode. By way of another example, the one or more processors 708 may apply one or more algorithms (e.g., a SCOL-based algorithm) to determine one or more overlay parameters of the third set of pattern elements 502.

In some embodiments, the method 900 may include a Step 916 wherein one or more overlay correctables are provided based on the one or more overlay parameters determined in at least one of Steps 910, 912, or 914. For example, Step 916 may include the controller 706 generating one or more control signals (or corrections to the control signals) for adjusting one or more parameters (e.g., fabrication settings, configuration, and the like) of one or more process tools (e.g., lithographic tools). The control signals (or corrections to the control signals) may be provided by the controller 706 as part of a feedback and/or feedforward control loop. The controller 706 may cause the one or more process tools to execute one or more adjustments to the one or more parameters of the one or more process tools based on the one or more control signals (or corrections to the control signals). In some embodiments, the controller 706 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

Figure 10:
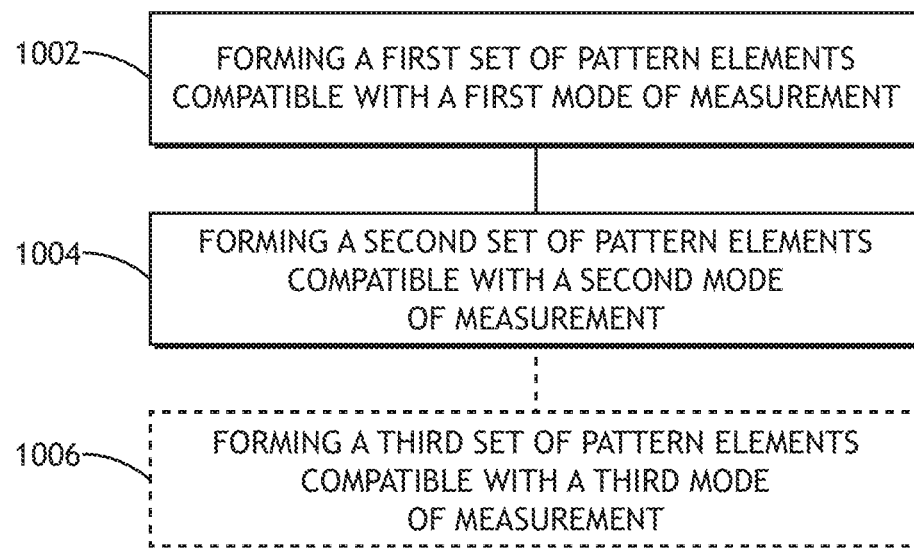
FIG. 10 is a process flow diagram depicting the steps of a method of forming a metrology target, in accordance with one or more embodiments of the present disclosure.

FIG. 10 illustrates a process flow diagram illustrating the steps of a method 1000 of forming a metrology target 100, in accordance with one or more embodiments of the present disclosure.

In Step 1002, a first set of pattern elements 102 compatible with a first metrology mode is formed. For example, the pattern elements 106a-106h of the first set of pattern elements 102 may be fabricated through one or more process steps such as, but not limited to, one or more deposition, lithographic, or etching steps, where the pattern elements 106a-106h of the first set of pattern elements 102 may be formed on different layers of the metrology target 100. The pattern elements 106a-106h may be formed using one or more process tools (e.g., lithographic tools).

In Step 1004, a second set of pattern elements 104 compatible with a second metrology mode is formed. For example, the second set of pattern elements 104 may be fabricated through one or more process steps such as, but not limited to, one or more deposition, lithographic, or etching steps, where the pattern elements 106a-106h of second set of pattern elements 104 may be formed on different layers of the metrology target 100. It is noted that Step 1004 is not limited to a formation of the second set of pattern elements 104 occurring sequentially following the formation of the first set of pattern elements 102, and that the second set of pattern elements 104 and the first set of pattern elements 102 may be formed simultaneously.

In some embodiments, the method 1000 may include a step 1006 wherein a third set of pattern elements 502 compatible with a third mode of measurement is formed. For example, the third set of pattern elements 502 may be fabricated through one or more process steps such as, but not limited to, one or more deposition, lithographic, or etching steps, where the third set of pattern elements 502 may be formed on different layers of the metrology target 100. It is noted that Step 1006 is not limited to a formation of the third set of pattern elements 502 occurring sequentially following the formation of the second set of pattern elements 104, and that the first set of pattern elements 102, the second set of pattern elements 104, and the third set of pattern elements 502 may be formed simultaneously.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. A metrology target comprising:
a first set of pattern elements, wherein the first set of pattern elements are compatible with a first metrology mode of a first metrology sub-system along one or more directions; and
a second set of pattern elements, wherein the second set of pattern elements is compatible with a second metrology mode of a second metrology sub-system along the one or more directions, wherein the second set of pattern elements includes a first portion of the first set of pattern elements, and wherein the second set of pattern elements is surrounded by a second portion of the first set of pattern elements not included in the second set of pattern elements.

2. The metrology target of claim 1, wherein at least some of the first set of pattern elements are segmented.

3. The metrology target of claim 1, wherein at least some of the second set of pattern elements are segmented.

4. The metrology target of claim 1, wherein at least some of the second set of pattern elements are divided into two or more sets of segmented portions.

5. The metrology target of claim 1, wherein the first metrology mode comprises an optical metrology mode.

6. The metrology target of claim 1, wherein the first metrology mode comprises at least one of advanced imaging metrology (AIM) or triple advanced imaging metrology (Triple AIM).

7. The metrology target of claim 1, wherein the second metrology mode comprises at least one of an optical metrology mode or a particle-beam based metrology mode.

8. The metrology target of claim 7, wherein the second metrology mode comprises advanced imaging metrology in-die (AIMid) metrology.

9. The metrology target of claim 7, wherein the second metrology mode comprises electron-beam metrology.

10. The metrology target of claim 1, further comprising a third set of pattern elements compatible with a third metrology mode of a third metrology sub-system along the one or more directions, wherein the third set of pattern elements surrounds at least a portion of the first set of pattern elements.

11. The metrology target of claim 10, wherein the third metrology mode comprises scatterometry-based overlay (SCOL) metrology.

12. A system comprising:
two or more metrology sub-systems, wherein the two or more metrology sub-systems are configured to acquire metrology signals from one or more metrology targets of a sample, wherein each of the two or more metrology sub-systems comprises:
an illumination source;
one or more illumination elements configured to direct an illumination beam from the illumination source onto the sample;
one or more detectors; and
one or more projection elements configured to collect illumination emanating from the sample and direct the illumination to the one or more detectors; and
one or more controllers having one or more processors communicatively coupled to the one or more detectors, wherein the one or more processors are configured to execute a set of program instructions maintained in memory, wherein the set of program instructions is configured to cause the one or more processors to:
receive, from a first metrology sub-system operating in a first metrology mode, one or more signals indicative of the illumination emanating from a first set of pattern elements of the one or more metrology targets of the sample,
receive, from a second metrology sub-system operating in a second metrology mode, one or more signals indicative of illumination emanating from a second set of pattern elements of the one or more metrology targets, wherein the one or more metrology targets of the sample comprise: the first set of pattern elements, wherein the first set of pattern elements is compatible with the first metrology mode of the first metrology sub-system along one or more directions; and the second set of pattern elements, wherein the second set of pattern elements is compatible with the second metrology mode of the second metrology sub-system along the one or more directions, wherein the second set of pattern elements includes a first portion of the first set of pattern elements, and wherein the second set of pattern elements is surrounded by a second portion of the first set of pattern elements not included in the second set of pattern elements;
determine one or more overlay parameters of the first set of pattern elements based on one or more signals acquired from the first set of pattern elements in the first metrology mode; and
determine one or more overlay parameters of the second set of pattern elements based on one or more signals acquired from the second set of pattern elements in the second metrology mode.

13. The system of claim 12, wherein at least some of the first set of pattern elements are segmented.

14. The system of claim 12, wherein at least some of the second set of pattern elements are segmented.

15. The system of claim 12, wherein at least some of the second set of pattern elements are divided into two or more sets of segmented portions.

16. The system of claim 12, wherein at least one of the two or more metrology sub-systems comprise:
an optical metrology tool.

17. The system of claim 12, wherein the two or more metrology sub-systems comprise:
an optical metrology tool; and
a particle-based metrology tool.

18. The system of claim 12, wherein the two or more metrology sub-systems comprise:
an optical metrology tool;
a particle-based metrology tool; and
a scatterometry-based overlay (SCOL) metrology tool.

19. The system of claim 16, wherein the first metrology mode comprises an optical metrology mode.

20. The system of claim 16, wherein the first metrology mode comprises at least one of advanced imaging metrology (AIM) or triple advanced imaging metrology (Triple AIM).

21. The system of claim 17, wherein the second metrology mode comprises at least one of an optical metrology mode or a particle-beam based metrology mode.

22. The system of claim 17, wherein the second metrology mode comprises advanced imaging metrology in-die (AIMid) metrology.

23. The system of claim 17, wherein the second metrology mode comprises electron-beam metrology.

24. The system of claim 12, wherein the one or more metrology targets further comprise a third set of pattern elements compatible with a third metrology mode of a third metrology sub-system along the one or more directions, wherein the third set of pattern elements surrounds at least a portion of the first set of pattern elements.

25. The system of claim 24, wherein the third metrology mode comprises: scatterometry-based overlay (SCOL) metrology.

26. The system of claim 25, wherein the one or more controllers are configured to determine one or more overlay parameters of the third set of pattern elements using the third metrology mode based on one or more signals from the two or more metrology sub-systems.

27. The system of claim 12, wherein the one or more processors are configured to execute the set of program instructions to cause the one or more processors to provide one or more overlay correctables based on the one or more overlay parameters.

28. A method of measuring overlay comprising:
illuminating a sample having one or more metrology targets;
detecting, in a first metrology mode of a first metrology sub-system, illumination emanating from a first set of pattern elements of the one or more metrology targets of the sample;
detecting, in a second metrology mode of a second metrology sub-system, illumination emanating from a second set of pattern elements of the one or more metrology targets of the sample;
determining one or more overlay parameters of the first set of pattern elements based on the illumination emanating from the first set of pattern elements; and
determining one or more overlay parameters of the second set of pattern elements based on the illumination emanating from the second set of pattern elements.

29. The method of measuring overlay of claim 28, wherein at least some of the first set of pattern elements are segmented.

30. The method of measuring overlay of claim 28, wherein at least some of the second pattern elements are segmented.

31. The method of measuring overlay of claim 28, wherein at least some of the second pattern elements are divided into two or more sets of segmented portions.

32. The method of measuring overlay of claim 28, wherein the first metrology mode comprises an optical metrology mode.

33. The method of measuring overlay of claim 28, wherein the first metrology mode comprises at least one of advanced imaging metrology (AIM) or triple advanced imaging metrology (Triple AIM).

34. The method of measuring overlay of claim 28, wherein the second metrology mode comprises at least one of an optical metrology mode or a particle-beam based metrology mode.

35. The method of measuring overlay of claim 28, wherein the second metrology mode comprises advanced imaging metrology in-die (AIMid) metrology.

36. The method of measuring overlay of claim 28, wherein the second metrology mode comprises electron-beam metrology.

37. The method of measuring overlay of claim 28, further comprising detecting, in a third metrology mode of a third metrology sub-system, illumination emanating from a third set of pattern elements of the one or more metrology targets of the sample, and determining one or more overlay parameters of the third set of pattern elements of the one or more metrology targets of the sample based on the illumination emanating from the third set of pattern elements.

38. The method of measuring overlay of claim 37, wherein the third metrology mode comprises: scatterometry-based overlay (SCOL) metrology.

39. A method of forming a metrology target comprising:
forming a first set of pattern elements, wherein the first set of pattern elements are compatible with a first metrology mode of a first metrology sub-system along one or more directions; and
forming a second set of pattern elements, wherein the second set of pattern elements is compatible with a second metrology mode of a second metrology sub-system along the one or more directions, wherein the second set of pattern elements includes a first portion of the first set of pattern elements, and wherein the second set of pattern elements is surrounded by a second portion of the first set of pattern elements not included in the second set of pattern elements.

40. The method of forming a metrology target of claim 39, wherein at least some of the first set of pattern elements are segmented.

41. The method of forming a metrology target of claim 39, wherein at least some of the second pattern elements are segmented.

42. The method of forming a metrology target of claim 39, wherein at least some of the second pattern elements are divided into two or more sets of segmented portions.

43. The method of forming a metrology target of claim 39, wherein the first metrology mode comprises an optical mode of measurement.

44. The method of forming a metrology target of claim 39, wherein the first metrology mode comprises at least one of advanced imaging metrology (AIM) or triple advanced imaging metrology (Triple AIM).

45. The method of forming a metrology target of claim 39, wherein the second metrology mode comprises at least one of an optical metrology mode or a particle-beam based metrology mode.

46. The method of forming a metrology target of claim 45, wherein the second metrology mode comprises advanced imaging metrology in-die (AIMid) metrology.

47. The method of forming a metrology target of claim 45, wherein the second metrology mode comprises electron-beam metrology.

48. The method of forming a metrology target of claim 39, further comprising forming a third set of pattern elements compatible with a third metrology mode of a third metrology sub-system along the one or more directions, wherein the third set of pattern elements surrounds at least a portion of the first set of pattern elements.

49. The method of forming a metrology target of claim 48, wherein the third metrology mode comprises scatterometry-based overlay (SCOL) metrology.

* * * * *